United States Patent
Liu et al.

(10) Patent No.: US 10,950,694 B2
(45) Date of Patent: Mar. 16, 2021

(54) DOPING FOR SEMICONDUCTOR DEVICE WITH CONDUCTIVE FEATURE

(71) Applicant: Taiwan Semiconductor Manufacturing Co., Ltd., Hsinchu (TW)

(72) Inventors: Su-Hao Liu, Jhongpu Township (TW); Huicheng Chang, Tainan (TW); Chia-Cheng Chen, Hsinchu (TW); Liang-Yin Chen, Hsinchu (TW); Kuo-Ju Chen, Taichung (TW); Chun-Hung Wu, New Taipei (TW); Chang-Maio Liu, Hsinchu (TW); Huai-Tei Yang, Hsinchu (TW); Lun-Kuang Tan, Hsinchu (TW); Wei-Ming You, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/433,374

(22) Filed: Jun. 6, 2019

(65) Prior Publication Data
US 2019/0288068 A1    Sep. 19, 2019

Related U.S. Application Data

(62) Division of application No. 15/797,703, filed on Oct. 30, 2017, now Pat. No. 10,347,720.

(51) Int. Cl.
*H01L 29/78* (2006.01)
*H01L 29/08* (2006.01)
(Continued)

(52) U.S. Cl.
CPC ...... *H01L 29/0847* (2013.01); *H01L 21/0257* (2013.01); *H01L 21/02532* (2013.01);
(Continued)

(58) Field of Classification Search
CPC .......... H01L 21/02532; H01L 21/0257; H01L 21/28518; H01L 21/823418;
(Continued)

(56) References Cited

U.S. PATENT DOCUMENTS 9,105,490 B2    11/2015    Wang et al.
9,236,267 B2     1/2016    De et al.
(Continued)

FOREIGN PATENT DOCUMENTS

CN       103227202 A       7/2013
DE    112011105702 T5      7/2014
(Continued)

OTHER PUBLICATIONS

Impellizzeri et al; Ga-implantation in Ge: Electrical activation and clustering; J. Appl. Phys. 106, pp. 013518 1-6 (2009); doi: 10.1063/1.3159031.
(Continued)

*Primary Examiner* — Hoai V Pham
(74) *Attorney, Agent, or Firm* — Slater Matsil, LLP

(57) ABSTRACT

The present disclosure relates generally to doping for conductive features in a semiconductor device. In an example, a structure includes an active region of a transistor. The active region includes a source/drain region, and the source/drain region is defined at least in part by a first dopant having a first dopant concentration. The source/drain region further includes a second dopant with a concentration profile having a consistent concentration from a surface of the source/drain region into a depth of the source/drain region. The consistent concentration is greater than the first dopant concentration. The structure further includes a conductive feature contacting the source/drain region at the surface of the source/drain region.

20 Claims, 21 Drawing Sheets

(51) Int. Cl.
  *H01L 29/167* (2006.01)
  *H01L 21/02* (2006.01)
  *H01L 21/285* (2006.01)
  *H01L 29/66* (2006.01)
  *H01L 21/265* (2006.01)
  *H01L 29/417* (2006.01)

(52) U.S. Cl.
  CPC .. *H01L 21/26513* (2013.01); *H01L 21/28518* (2013.01); *H01L 29/167* (2013.01); *H01L 29/41791* (2013.01); *H01L 29/665* (2013.01); *H01L 29/66795* (2013.01); *H01L 29/785* (2013.01); *H01L 29/7848* (2013.01)

(58) Field of Classification Search
  CPC ......... H01L 21/823814; H01L 29/0847; H01L 29/167; H01L 29/7848; H01L 29/785; H01L 29/78618
  See application file for complete search history.

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,679,967 | B1 | 6/2017 | Ando et al. |
| 9,831,183 | B2 | 11/2017 | Lin et al. |
| 9,859,386 | B2 | 1/2018 | Ho et al. |
| 2003/0193066 | A1 | 10/2003 | Ito et al. |
| 2011/0101457 | A1 | 5/2011 | Yako |
| 2017/0221724 | A1 | 8/2017 | Murthy et al. |
| 2017/0256456 | A1 | 9/2017 | Lee et al. |
| 2018/0047623 | A1 | 2/2018 | Xie |
| 2018/0286861 | A1* | 10/2018 | Choi .................. H01L 21/2253 |

FOREIGN PATENT DOCUMENTS

| | | |
|---|---|---|
| JP | 2006005373 A | 1/2006 |
| JP | 2011086728 A | 4/2011 |
| KR | 20170103612 A | 9/2017 |
| TW | 201603187 A | 1/2016 |

OTHER PUBLICATIONS

Satta et al.; Diffusion, activation, and recrystallization of boron implanted in preamorphized and crystalline germanium; Appl. Phys. Lett. 87, 172109 (2005); doi: 10.1063/1.2117631.

Geert Hellings et al., "Implantation, Diffusion, Activation, and Recrystallization of Gallium Implanted in Preamorphized and Crystalline Germanium" Electrochemical and Solid-State Letters, vol. 12, 2009, H417-H419.

* cited by examiner

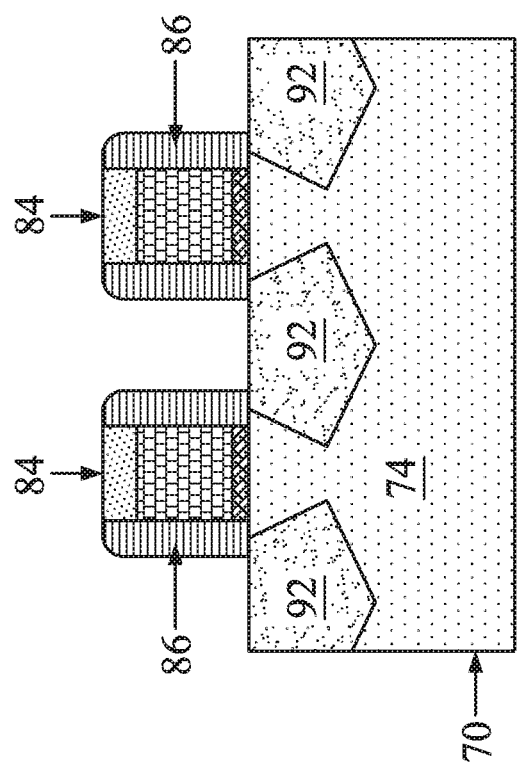
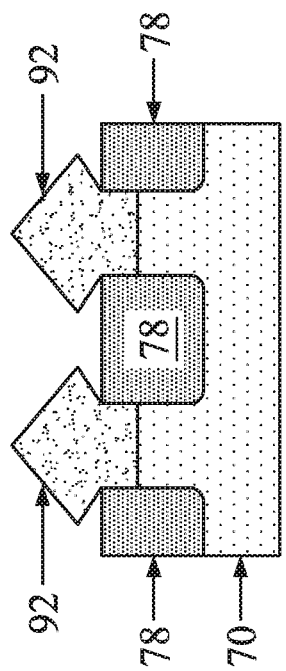
FIG. 8A
FIG. 8B

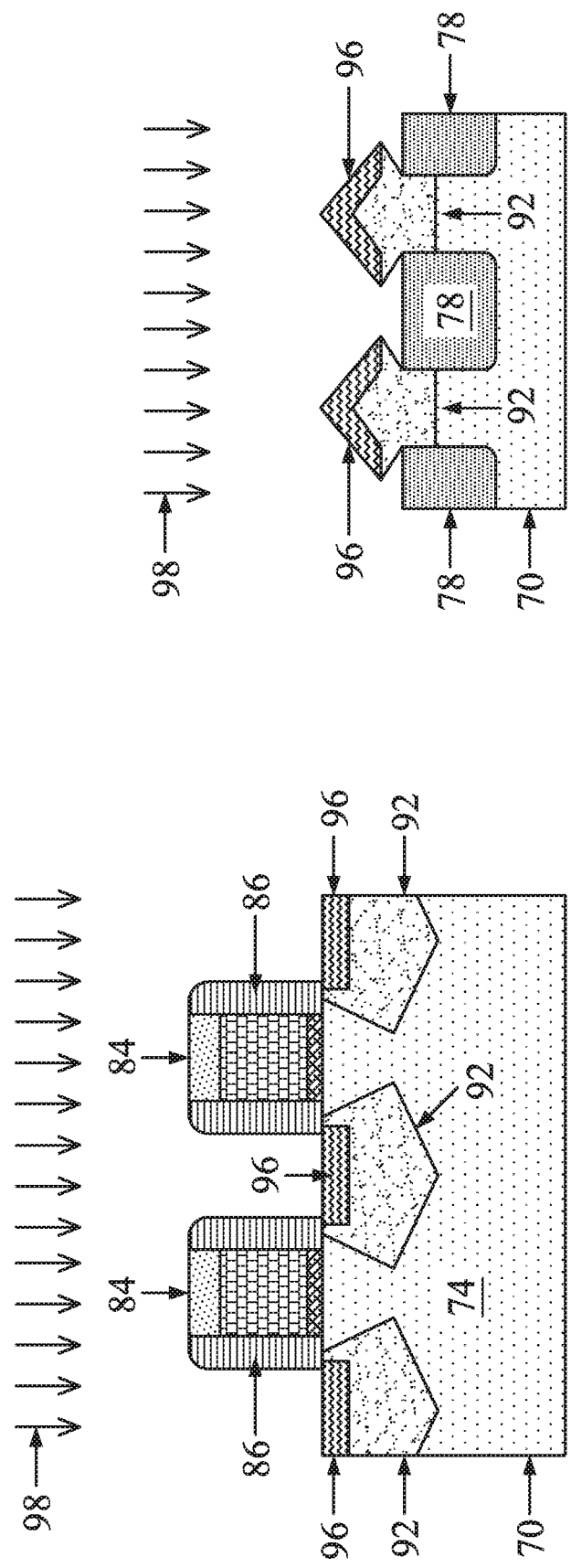

DOPING FOR SEMICONDUCTOR DEVICE WITH CONDUCTIVE FEATURE

PRIORITY CLAIM AND CROSS-REFERENCE

This application is a divisional of U.S. application Ser. No. 15/797,703, filed on Oct. 30, 2017, now U.S. Pat. No. 10,347,720, entitled "Doping for Semiconductor Device with Conductive Feature", which application is hereby incorporated herein by reference.

BACKGROUND

With the increasing down-sizing of integrated circuits, the silicide regions, and hence the contact between the contact plugs and the silicide regions, are also becoming increasingly smaller. Accordingly, contact resistance may become increasingly higher. For example, in Fin Field-Effect Transistors (FinFETs), the fins are very narrow, causing the contact areas between the contacts and the fins to be very small.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-B, 3A-B, 4A-B, 5A-B, 6A-B, 7A-B, 8A-B, 9A-B, 10A-B, 11A-B, 12A-B, 13A-B, 14A-B, 15A-B, 16A-B, and 17A-B are cross-sectional views of intermediate stages in an example process of forming one or more FinFETs in accordance with some embodiments.

DETAILED DESCRIPTION

Figure 1:
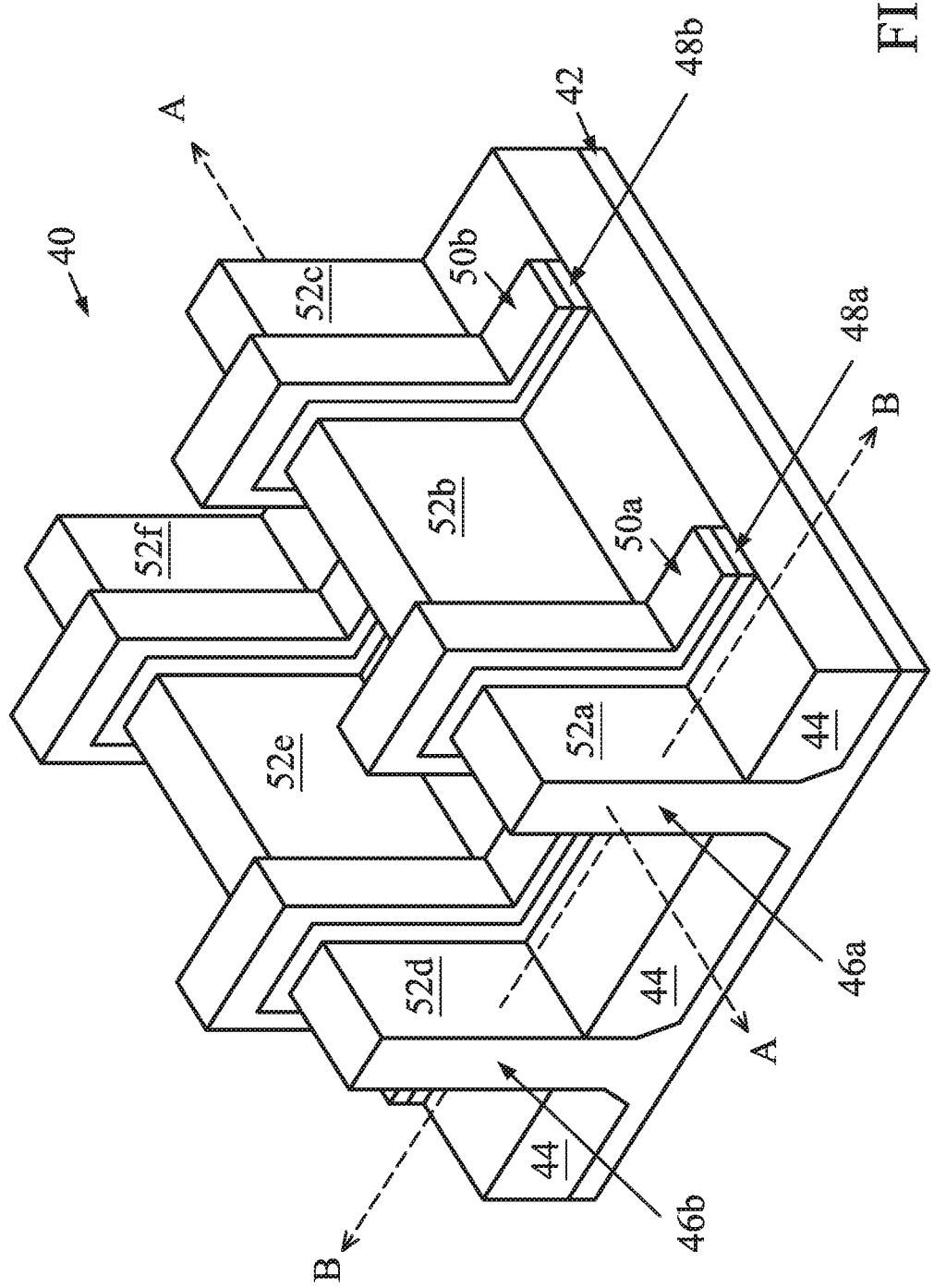
FIG. 1 is a three-dimensional view of an example of simplified Fin Field-Effect Transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conductive features, e.g., including contacts, to source/drain regions of transistors, for example, and methods for forming such conductive features are described. In some examples, a dopant, such as gallium in some examples, is implanted into source/drain regions with a profile that has a platform concentration near a surface of the source/drain region that is greater than a doping concentration of a remainder of the source/drain region. The platform concentration can reduce a resistance of a contact to the source/drain region.

Example conductive features described and illustrated herein are implemented in Fin Field-Effect Transistors (FinFETs); however, conductive features within the scope of this disclosure may also be implemented in planar transistors and/or other semiconductor devices. Further, intermediate stages of forming FinFETs are illustrated. Some embodiments described herein are described in the context of FinFETs formed using a replacement gate process. In other examples, a gate-first process may be used. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps described herein.

FIG. 1 illustrates an example of simplified FinFETs 40 in a three-dimensional view. Other aspects not illustrated in or described with respect to FIG. 1 may become apparent from the following figures and description. The structure in FIG. 1 may be electrically connected or coupled in a manner to operate as, for example, one transistor or more, such as four transistors.

The FinFETs 40 comprise fins 46*a* and 46*b* on a substrate 42. The substrate 42 includes isolation regions 44, and the fins 46*a* and 46*b* each protrude above and from between neighboring isolation regions 44. Gate dielectrics 48*a* and 48*b* are along sidewalls and over top surfaces of the fins 46*a* and 46*b*, and gate electrodes 50*a* and 50*b* are over the gate dielectrics 48*a* and 48*b*, respectively. Source/drain regions 52*a-f* are disposed in respective regions of the fins 46*a* and 46*b*. Source/drain regions 52*a* and 52*b* are disposed in opposing regions of the fin 46*a* with respect to the gate dielectric 48*a* and gate electrode 50*a*. Source/drain regions 52*b* and 52*c* are disposed in opposing regions of the fin 46*a* with respect to the gate dielectric 48*b* and gate electrode 50*b*. Source/drain regions 52*d* and 52*e* are disposed in opposing regions of the fin 46*b* with respect to the gate dielectric 48*a* and gate electrode 50*a*. Source/drain regions 52*e* and 52*f* are disposed in opposing regions of the fin 46*b* with respect to the gate dielectric 48*b* and gate electrode 50*b*.

In some examples, four transistors may be implemented by: (1) source/drain regions 52*a* and 52*b*, gate dielectric 48*a*, and gate electrode 50*a*; (2) source/drain regions 52*b* and 52*c*, gate dielectric 48*b*, and gate electrode 50*b*; (3) source/drain regions 52*d* and 52*e*, gate dielectric 48*a*, and gate electrode 50*a*; and (4) source/drain regions 52*e* and 52*f*, gate dielectric 48*b*, and gate electrode 50*b*. As indicated, some source/drain regions may be shared between various transistors, and other source/drain regions that are not illustrated as being shared may be shared with neighboring transistors that are not illustrated, for example. In some examples, various ones of the source/drain regions may be connected or coupled together such that FinFETs are implemented as two functional transistors. For example, if neighboring (e.g., as opposed to opposing) source/drain regions 52*a-f* are electrically connected, such as through coalescing the regions by epitaxial growth (e.g., source/drain regions 52*a* and 52*d* being coalesced, source/drain regions 52*b* and 52*e* being coalesced, etc.), two functional transistors may be implemented. Other configurations in other examples may implement other numbers of functional transistors.

FIG. 1 further illustrates reference cross-sections that are used in later figures. Cross-section A-A is in a plane along, e.g., channels in the fin 46*a* between opposing source/drain regions 52*a-f*. Cross-section B-B is in a plane perpendicular to cross-section A-A and is across source/drain region 52*a* in fin 46*a* and across source/drain region 52*d* in fin 46*b*. Subsequent figures refer to these reference cross-sections for clarity.

FIGS. 2A-B through 17A-B are cross-sectional views of intermediate stages in an example process of forming one or more FinFETs in accordance with some embodiments. In FIGS. 2A-B through 17A-B, figures ending with an "A" designation illustrate cross-sectional views along a cross-section similar to cross-section A-A in FIG. 1, and figures ending with a "B" designation illustrate cross-sectional views along a cross-section similar to cross-section B-B in FIG. 1. In some figures, some reference numbers of components or features illustrated therein may be omitted to avoid obscuring other components or features; this is for ease of depicting the figures.

Figure 2A:
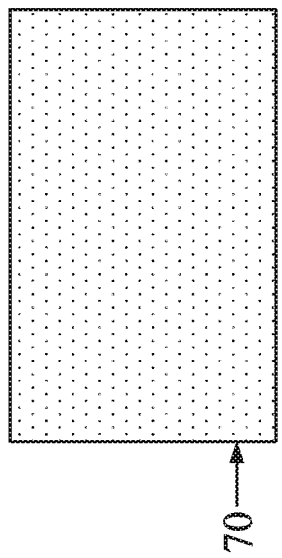
Figure 2B:
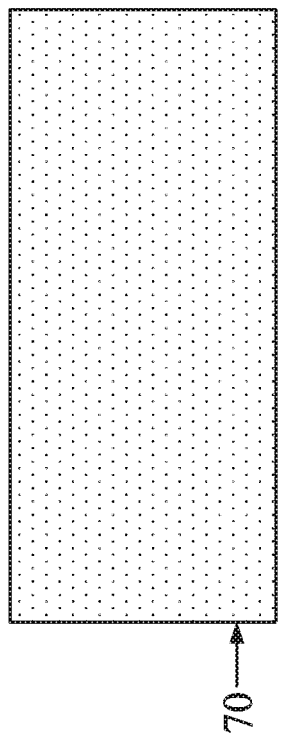

FIGS. 2A and 2B illustrate a semiconductor substrate 70. The semiconductor substrate 70 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate layer may include silicon (Si); germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

Figure 3B:
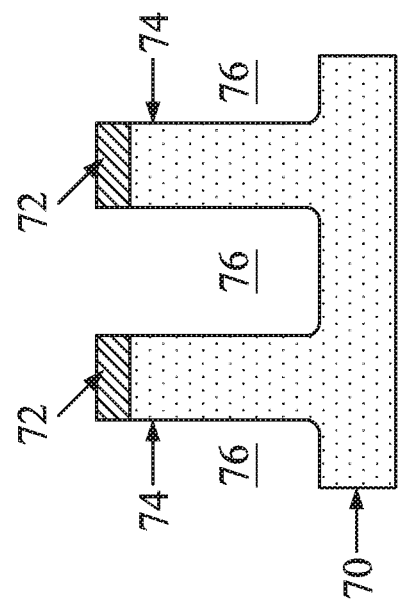
Figure 3A:
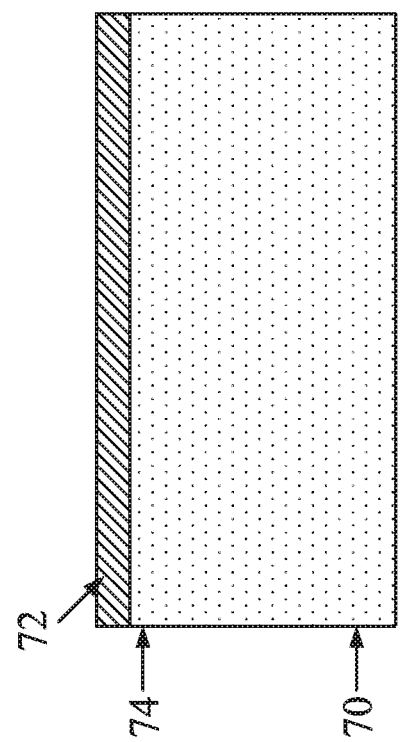

FIGS. 3A and 3B illustrate the formation of fins 74 in the semiconductor substrate 70. In the illustrated example, a mask 72 (e.g., a hard mask) is used in forming the fins 74. For example, one or more mask layers are deposited over the semiconductor substrate 70, and the one or more mask layers are then patterned into the mask 72. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask 72. The etch process may include a reactive ion etch (RIE), neutral beam etch (NBE), the like, or a combination thereof. The etching may be anisotropic. Subsequently, the photo resist is removed in an ashing or wet strip processes, for example.

Using the mask 72, the semiconductor substrate 70 may be etched such that trenches 76 are formed between neighboring pairs of fins 74 and such that the fins 74 protrude from the semiconductor substrate 70. The etch process may include a RIE, NBE, the like, or a combination thereof. The etching may be anisotropic.

Figure 4B:
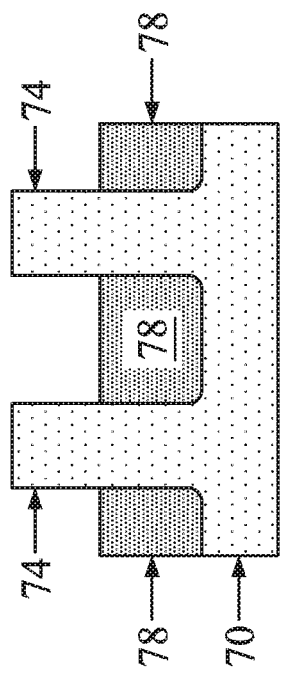
Figure 4A:
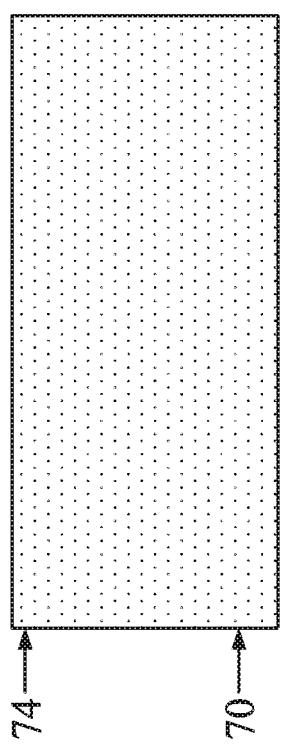

FIGS. 4A and 4B illustrate the formation of isolation regions 78, each in a corresponding trench 76. The isolation regions 78 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 78 include silicon oxide that is formed by a FCVD process. A planarization process, such as a chemical mechanical polish (CMP), may remove any excess insulating material and any remaining mask 72 to form top surfaces of the insulating material and top surfaces of the fins 74 to be coplanar. The insulating material may then be recessed to form the isolation regions 78. The insulating material is recessed such that the fins 74 protrude from between neighboring isolation regions 78, which may, at least in part, thereby delineate the fins 74 as active areas on the semiconductor substrate 70. The insulating material may be recessed using an acceptable etching process, such as one that is selective to the material of the insulating material. For example, a chemical oxide removal using a CERTAS® etch or an Applied Materials SICONI tool or dilute hydrofluoric (dHF) acid may be used. Further, top surfaces of the isolation regions 78 may have a flat surface as illustrated, a convex surface, a concave surface (such as dishing), or a combination thereof, which may result from an etch process.

A person having ordinary skill in the art will readily understand that the process described with respect to FIGS. 2A-B through 4A-B is just one example of how fins 74 may be formed. In other embodiments, a dielectric layer can be formed over a top surface of the semiconductor substrate 70; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 74 can be recessed (e.g., after planarizing the insulating material of the isolation regions 78 and before recessing the insulating layer), and a material different from the fins may be epitaxially grown in their place. In an even further embodiment, a dielectric layer can be formed over a top surface of the semiconductor substrate 70; trenches can be etched through the dielectric layer; heteroepitaxial structures can be epitaxially grown in the trenches using a material different from the semiconductor substrate 70; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material in for a p-type device. In various embodiments, the fins 74 may comprise silicon, silicon germanium ($Si_xGe_{1-x}$, where x can be between approximately 0 and 100), silicon carbide, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like.

Figure 5B:
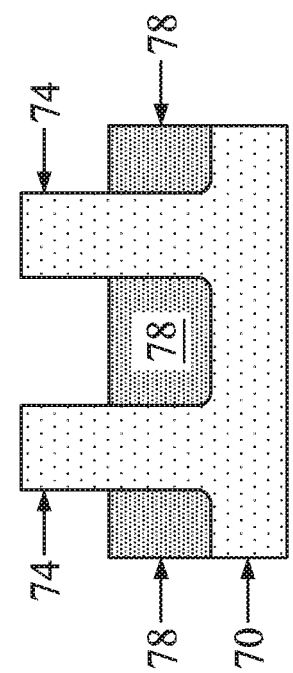
Figure 5A:
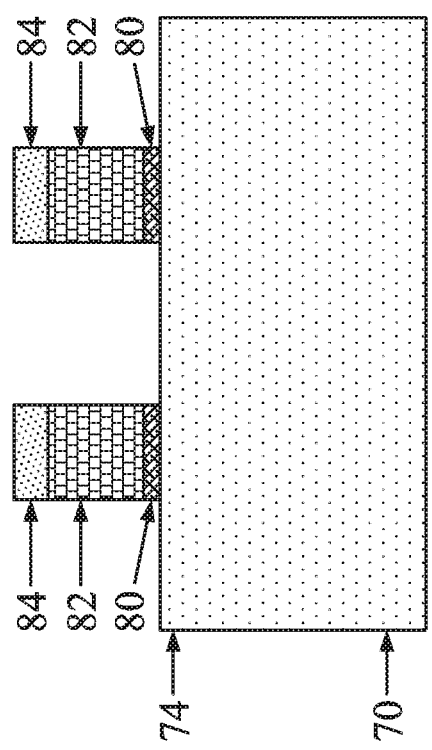

FIGS. 5A and 5B illustrate the formation of dummy gate stacks on the fins 74. Each dummy gate stack comprises an etch stop 80, a dummy gate 82, and a mask 84. The etch stop 80, dummy gate 82, and mask 84 may be formed by sequentially depositing respective layers and patterning those layers. For example, a layer for the etch stop 80 may include or be silicon oxide, silicon nitride, the like, or multilayers thereof, and may be thermally grown or deposited, such as by plasma-enhanced CVD (PECVD), ALD, or another deposition technique. A layer for the dummy gate 82 may include or be silicon (e.g., polysilicon) or another material deposited by CVD, PVD, or another deposition technique. A layer for the mask 84 may include or be silicon nitride, silicon oxynitride, silicon carbon nitride, the like, or a combination thereof, deposited by CVD, PVD, ALD, or another deposition technique. The layers for the mask 84, dummy gate 82, and etch stop 80 may then be patterned, for example, using photolithography and one or more etch processes, like described above with respect to FIGS. 3A and 3B, to form the mask 84, dummy gate 82, and etch stop 80 for each gate stack.

In the illustrated example, a dummy gate stack is implemented for a replacement gate process. In other examples, a gate-first process may be implemented using gate stacks including, for example, a gate dielectric in the place of the etch stop 80, and a gate electrode in the place of the dummy gate 82. In some gate-first processes, the gate stack may be formed using similar processes and materials as described with respect to the dummy gate stacks; although in other examples, other processes or materials may be implemented. For example, a gate dielectric may include or be a high-k dielectric material, such as having a k value greater than about 7.0, which may include a metal oxide or silicate of Hf, Al, Zr, La, Mg, Ba, Ti, Pb, multilayers thereof, or a combination thereof. A gate dielectric may also be deposited by molecular-beam deposition (MBD), ALD, PECVD, or another deposition technique. A gate electrode may also include or be a metal-containing material such as TiN, TaN, TaC, Co, Ru, Al, multi-layers thereof, or a combination thereof.

Figure 6B:
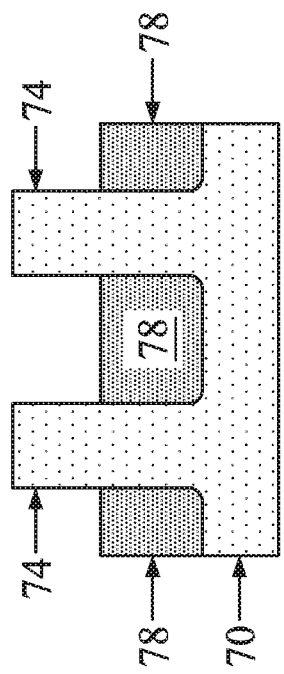
Figure 6A:
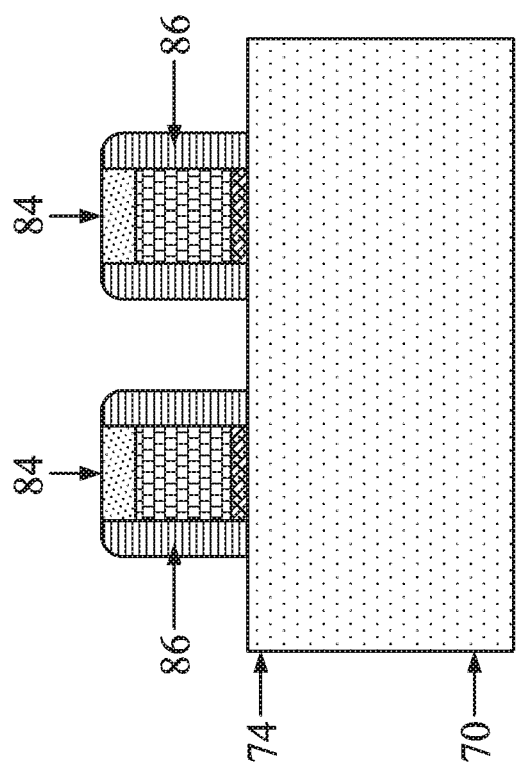

FIGS. 6A and 6B illustrate the formation of gate spacers 86. Gate spacers 86 are formed along sidewalls of the dummy gate stacks (e.g., sidewalls of the etch stop 80, dummy gate 82, and mask 84). The gate spacers 86 may be formed by conformally depositing one or more layers for the gate spacers 86 and anisotropically etching the one or more layers, for example. The one or more layers for the gate spacers 86 may include or be silicon nitride, silicon oxynitride, silicon carbon nitride, the like, multi-layers thereof, or a combination thereof, and the etch process can include a RIE, NBE, or another etching process.

Figure 7B:
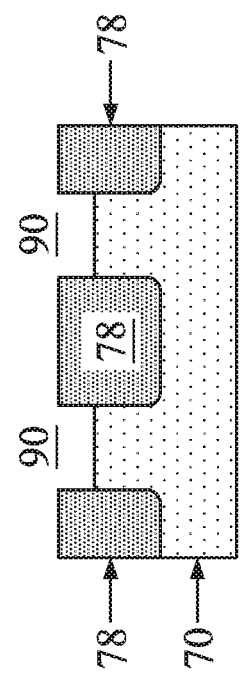
Figure 7A:
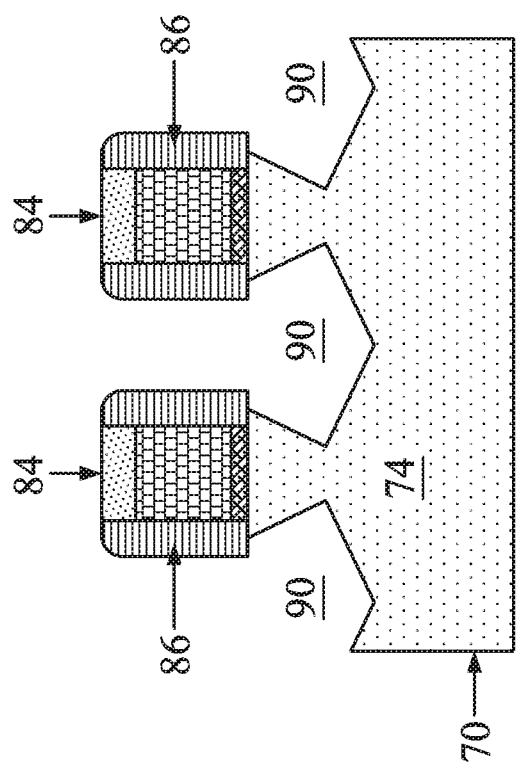

FIGS. 7A and 7B illustrate the formation of recesses 90 for source/drain regions. As illustrated, the recesses 90 are formed in the fins 74 on opposing sides of the dummy gate stacks. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a RIE, NBE, or the like, or a wet etch, such as using tetramethylammonium hydroxide (TMAH), ammonium hydroxide ($NH_4OH$), or another etchant.

FIGS. 8A and 8B illustrate the formation of epitaxy source/drain regions 92 in the recesses 90. The epitaxy source/drain regions 92 may include or be silicon germanium ($Si_xGe_{1-x}$, where x can be between approximately 0 and 100), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 92 may be formed in the recesses 90 by epitaxially growing a material in the recesses 90, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 8A and 8B, due to blocking by the isolation regions 78, epitaxy source/drain regions 92 are first grown vertically in recesses 90, during which time the epitaxy source/drain regions 92 do not grow horizontally. After the recesses 90 are fully filled, the epitaxy source/drain regions 92 may grow both vertically and horizontally to form facets, which may correspond to crystalline planes of the semiconductor substrate 70. In some examples, different materials are used for epitaxy source/drain regions for p-type devices and n-type devices. Appropriate masking during the recessing or epitaxial growth may permit different materials to be used in different devices.

A person having ordinary skill in the art will also readily understand that the recessing and epitaxial growth of FIGS. 7A-B and 8A-B may be omitted, and that source/drain regions may be formed by implanting dopants into the fins 74. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Example dopants can include or be, for example, boron for a p-type device and phosphorus or arsenic for an n-type device, although other dopants may be used. The epitaxy source/drain regions 92 (or other source/drain region) may have a dopant concentration in a range from about $10^{19}$ $cm^{-3}$ to about $10^{21}$ $cm^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

Figure 9A:
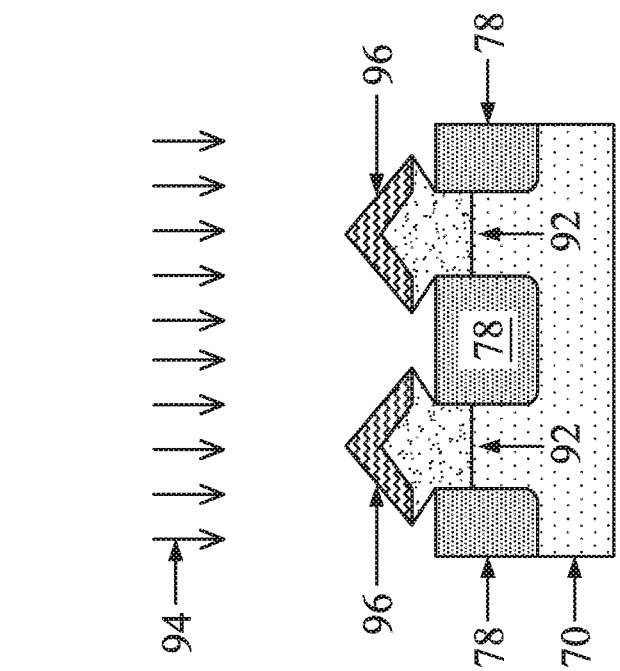
Figure 9B:
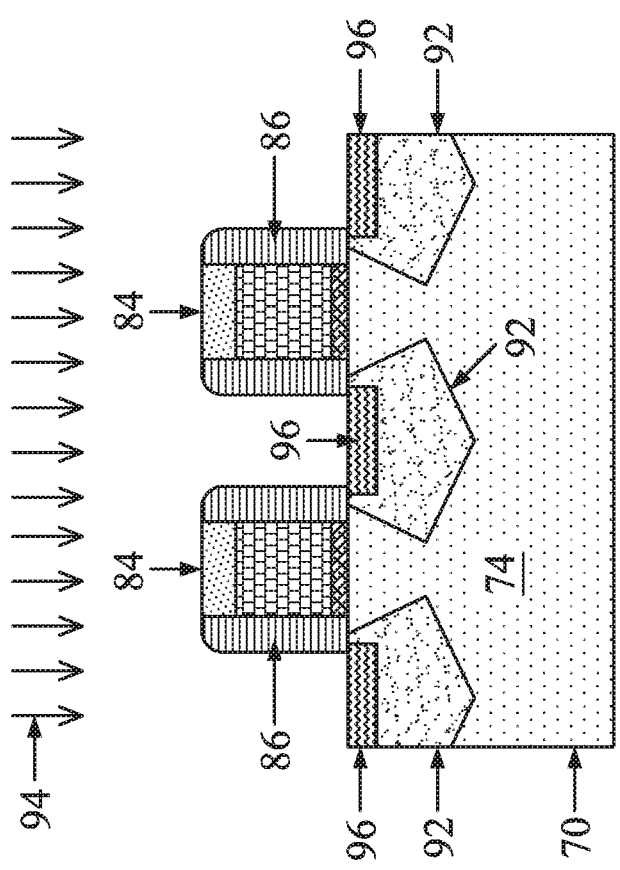

FIGS. 9A and 9B illustrate an amorphization implant 94. The amorphization implant 94 may be omitted in some implementations. In some examples, the amorphization implant 94 includes implanting an impurity species into the epitaxy source/drain regions 92 to make upper portions 96 of the epitaxy source/drain regions 92 amorphous. The upper portions 96 that are made amorphous can extend from respective upper surfaces of the epitaxy source/drain regions 92 to a depth from about 2 nm to about 20 nm, for example. In some examples, such as for a p-type device, the epitaxy source/drain regions 92 are $Si_xGe_{1-x}$, and germanium is the species implanted to amorphize the upper portions 96 of the epitaxy source/drain regions 92. In such examples, the implant energy can be in a range from about 1 keV to about 15 keV, such as about 10 keV, with a dosage concentration in a range from about $5 \times 10^{13}$ cm$^{-2}$ to about $5 \times 10^{14}$ cm$^{-2}$.

FIGS. 10A and 10B illustrate a dopant implant 98 into the upper portions 96 of the epitaxy source/drain regions 92. The dopant implant 98 may implant dopants to the upper portions 96 to reduce a contact resistance between the respective epitaxy source/drain region 92 and a conductive feature (e.g., including a contact) that is subsequently formed. In some examples, the species of the dopant used for the dopant implant 98 may amorphize the upper portions 96 when implanted (and hence, may be referred to as self-amorphizing). In those examples or in different examples, the amorphization implant 94 of FIGS. 9A and 9B may be omitted. The dopant implant 98 may implant dopants to the upper portions 96 such that the upper portions 96 have a consistent concentration of the dopant from the respective upper surfaces of the upper portions 96 to depths of equal to or greater than 5 nm, equal to or greater than 10 nm, or equal to or greater than 15 nm. The consistent concentration of the dopant can be greater than the concentration of the dopant that delineates, at least in part, the source/drain regions (e.g., formed by implantation and/or in situ doping during epitaxial growth). The concentration of the dopant in the epitaxy source/drain regions 92 may decrease from the consistent concentration into further depths of the epitaxy source/drain regions 92. Additional example details of the dopant implant 98 and the concentrations of the dopant resulting from the dopant implant 98 are described with respect to FIGS. 20 and 21 below.

In some examples, such as for a p-type device, the epitaxy source/drain regions 92 are $Si_xGe_{1-x}$, and gallium is the species implanted into the upper portions 96 of the epitaxy source/drain regions 92 for the dopant implant 98. In such examples, the implant energy can be in a range from about 0.5 keV to about 10 keV, with a dosage concentration in a range from about $1 \times 10^{15}$ cm$^{-2}$ to about $1 \times 10^{16}$ cm$^{-2}$. The consistent concentration of gallium from the upper surfaces of the epitaxy source/drain regions 92 to the depth may be in a range from about $10^{21}$ cm$^{-3}$ to about $10^{22}$ cm$^{-3}$, and more particularly, about $5 \times 10^{21}$ cm$^{-3}$.

After the dopant implant 98, an anneal is performed to activate the dopants and recrystallize the upper portions 96 that were amorphized (e.g., by the amorphization implant 94 and/or by the dopant implant 98). The anneal, in some examples, may be at a temperature in a range from about 600° C. to about 900° C. for a duration in a range equal to or less than about one minute, equal to or less than about 12 seconds, or equal to or less than about 1 second. In other examples, the anneal may be a laser anneal performed for a duration of several nanoseconds, such as equal to or less than about 100 ns. In further examples, the anneal may be a melting anneal performed for a duration of a few nanoseconds, such as about 1 ns.

Figure 11A:
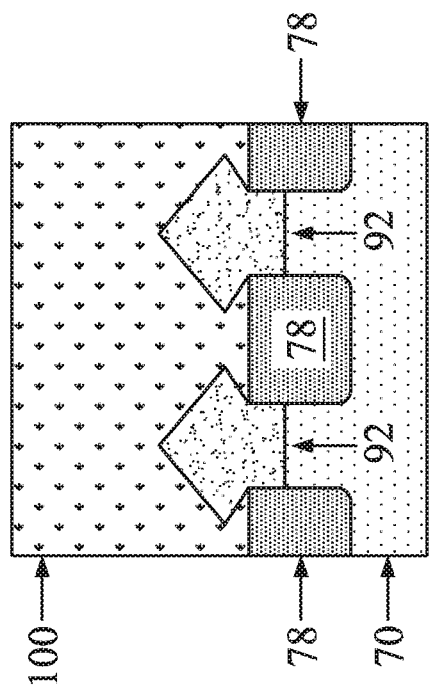
Figure 11B:
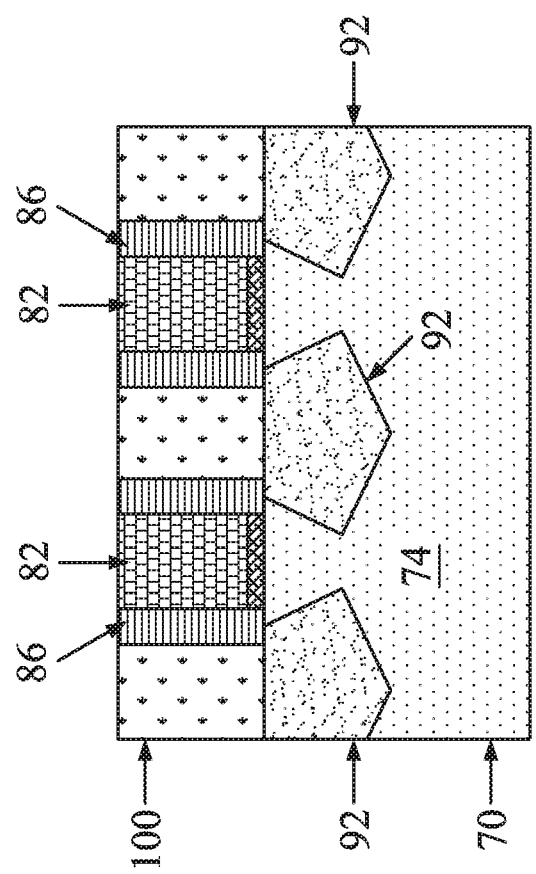

FIGS. 11A and 11B illustrate the formation of one or more dielectric layers 100. The one or more dielectric layers 100 may include an etch stop layer (ESL) and an interlayer dielectric (ILD), for example. Generally, an etch stop layer can provide a mechanism to stop an etching process when forming, e.g., contacts or vias. An etch stop layer may be formed of a dielectric material having a different etch selectivity from adjacent layers, for example, the interlayer dielectric. The etch stop layer may be conformally deposited over the epitaxy source/drain regions 92, dummy gate stacks, spacers 86, and isolation regions 78. The etch stop layer may comprise or be silicon nitride, silicon carbon nitride, silicon carbon oxide, carbon nitride, the like, or a combination thereof, and may be deposited by CVD, PECVD, ALD, or another deposition technique. The interlayer dielectric may comprise or be silicon dioxide, a low-K dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The interlayer dielectric may be deposited by spin-on, CVD, FCVD, PECVD, PVD, or another deposition technique.

The one or more dielectric layers 100 are formed with top surface(s) coplanar with top surfaces of the dummy gates 82. A planarization process, such as a CMP, may be performed to level the top surface of the one or more dielectric layers 100 with the top surfaces of the dummy gates 82. The CMP may also remove the mask 84 (and, in some instances, upper portions of the spacers 86) on the dummy gates 82. Accordingly, top surfaces of the dummy gates 82 are exposed through the one or more dielectric layers 100.

Figure 12B:
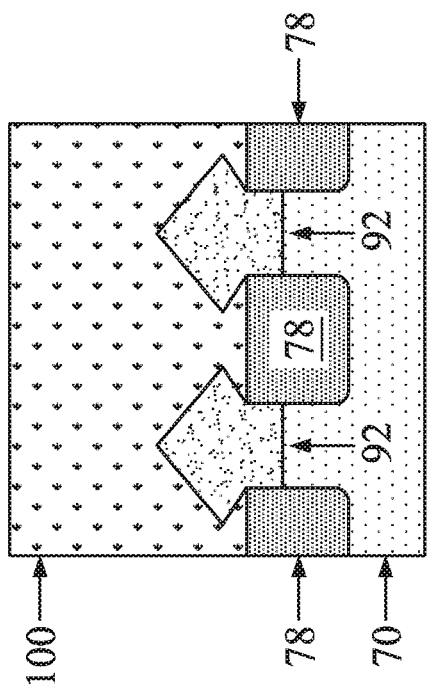
Figure 12A:
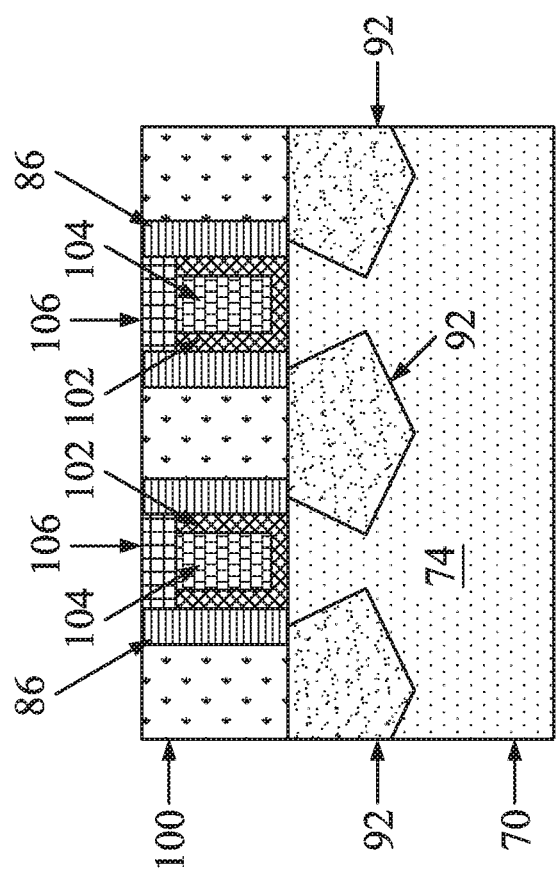

FIGS. 12A and 12B illustrate the replacement of the dummy gate stacks with gate dielectrics 102, gate electrodes 104, and masks 106. The dummy gates 82 and etch stops 80 are removed, such as by one or more etch processes. The dummy gates 82 may be removed by an etch process, wherein the etch stops 80 act as etch stop layers, and subsequently, the etch stops 80 can be removed by a different etch process. The etch processes can be, for example, a RIE, NBE, a wet etch, or another etch process.

A layer for the gate dielectrics 102 is formed, e.g., where the dummy gates 82 and etch stops 80 were removed. For example, the layer for the gate dielectrics 102 can be conformally deposited along sidewalls of the gate spacers 86, top surfaces and sidewalls of the fins 74 where dummy gate stacks were removed, and over the top surface of the one or more dielectric layers 100. The layer for the gate dielectrics 102 can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof. The layer for the gate dielectrics 102 can be deposited by ALD, PECVD, MBD, or another deposition technique.

A layer for the gate electrodes 104 is formed over the layer for the gate dielectrics 102. The layer for the gate electrodes 104 can fill remaining regions where the dummy gate stacks were removed. The layer for the gate electrodes may be or comprise a metal-containing material such as TiN, TaN, TaC, Co, Ru, Al, multi-layers thereof, or a combination thereof. The layer for the gate electrodes 104 can be deposited by ALD, PECVD, MBD, PVD, or another deposition technique.

Portions of the layers for the gate electrodes 104 and the gate dielectrics 102 above the top surface of the one or more dielectric layers 100 are removed. For example, a planarization process, like a CMP, may remove the portions of the layers for the gate electrodes 104 and the gate dielectrics 102 above the top surface of the one or more dielectric layers 100. Subsequently, an etch-back may recess top surfaces of the gate electrodes 104 and gate dielectrics 102 to a level below the top surface of the one or more dielectric layers 100. The etch-back may be a RIE, wet etch, or another etch process, for example. The gate electrodes 104 and gate dielectrics 102 may therefore be formed as illustrated in FIG. 12A.

A layer for the masks 106 is formed over the gate electrodes 104 and gate dielectrics 102 (e.g., where the gate electrodes 104 and gate dielectrics 102 have been etched back) and over the one or more dielectric layers 100. The layer for the masks 106 may include or be silicon nitride, silicon oxynitride, silicon carbide, silicon carbon nitride, the like, or a combination thereof, and may be deposited by CVD, PVD, ALD, or another deposition technique. Portions of the layer for the masks 106 above the top surface of the one or more dielectric layers 100 are removed. For example, a planarization process, like a CMP, may remove the portions of the layer for masks 106 above the top surface of the one or more dielectric layers 100, and top surfaces of the masks 106 may be formed coplanar with the top surface of the one or more dielectric layers 100.

As indicated previously, gate stacks with a gate dielectric and gate electrode may be implemented in a gate-first process rather than a replacement gate process as illustrated. In such examples, some process steps described with respect to FIGS. 11A-B and 12A-B may be omitted. For example, if a planarization process is used in FIGS. 11A-B, the top surface of the one or more dielectric layers 100 may remain above top surfaces of the gate stacks. The removal of dummy gate stacks and the replacement gate dielectrics, gate electrodes, and masks in FIGS. 12A-B may be omitted.

Figure 13B:
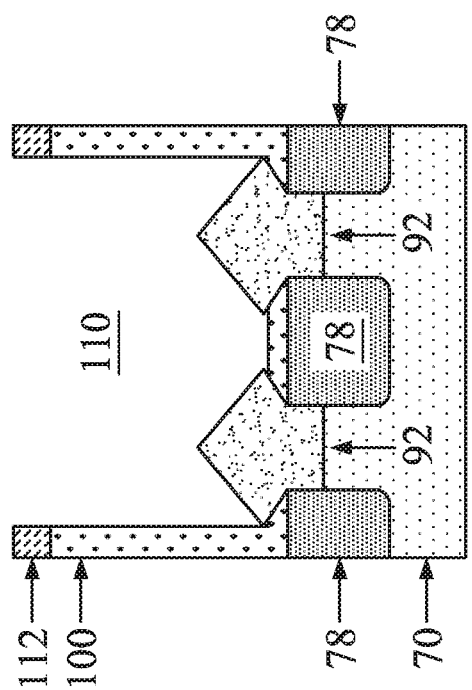
Figure 13A:
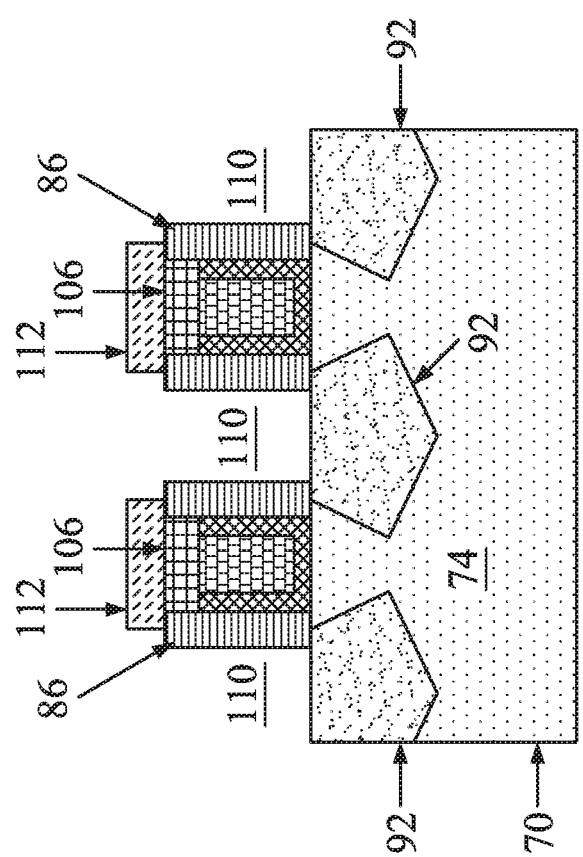

FIGS. 13A and 13B illustrate the formation of openings 110 through the one or more dielectric layers 100 to the epitaxy source/drain regions 92 to expose at least respective portions of the epitaxy source/drain regions 92. A mask 112 is formed on the one or more dielectric layers 100 and masks 106 for forming the openings 110. A layer for the mask 112 may include or be silicon nitride, silicon oxynitride, silicon carbon nitride, the like, or a combination thereof, deposited by CVD, PVD, ALD, or another deposition technique. The layer for the mask 112 may then be patterned, for example, using photolithography and one or more etch processes. Using the mask 112, the openings 110 can be formed through the one or more dielectric layers 100 using one or more etch processes, such as RIE, NBE, or another etch process.

Although not specifically illustrated, an amorphization implant may be performed to amorphize upper portions of the epitaxy source/drain regions 92 where silicide regions are to be formed, as described below. The amorphized upper portions of the epitaxy source/drain regions 92 may permit more efficient and/or faster formation of silicide compared to formation of silicide without using an amorphization implant. In some examples, the species used for the amorphization implant is germanium or another species.

Figure 14B:
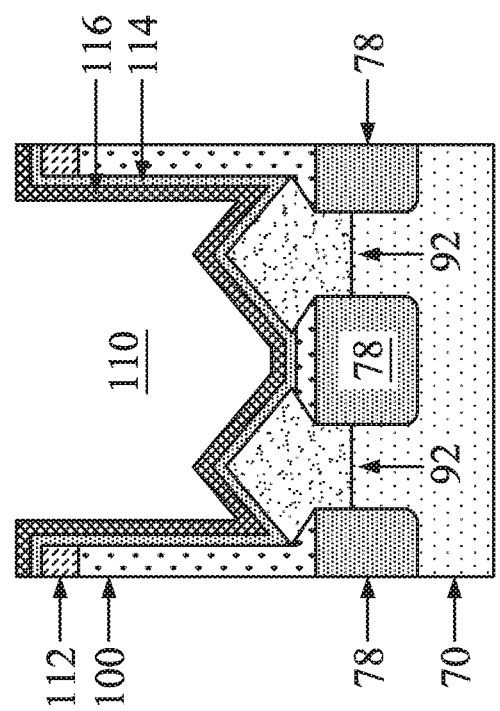
Figure 14A:
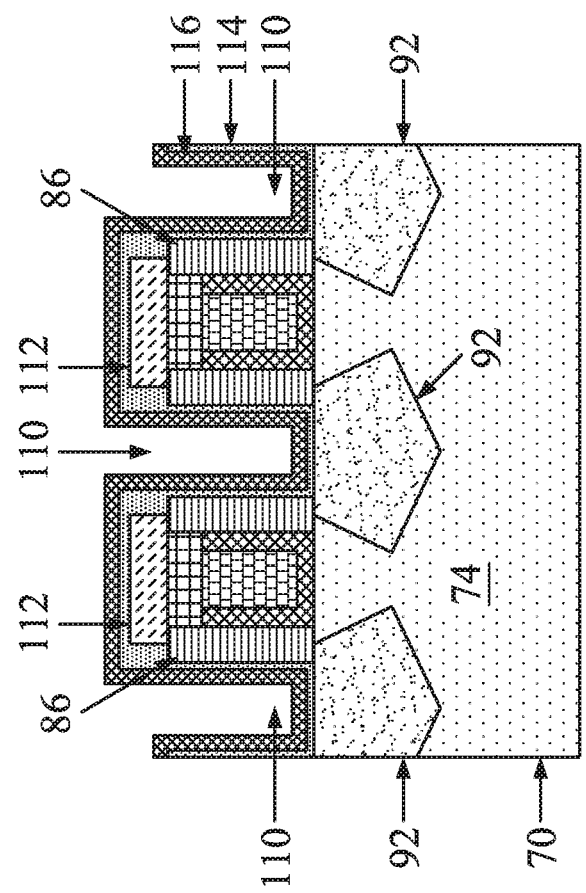

FIGS. 14A and 14B illustrate the formation of a metal layer 114 and a barrier layer 116 in the openings 110. The metal layer 114 is conformally deposited in the openings 110, and the barrier layer 116 is conformally deposited on the metal layer 114. Particularly, the metal layer 114 is deposited on upper surfaces of the epitaxy source/drain regions 92 exposed by the openings 110, and along other surfaces of the openings 110. The metal layer 114 may be or comprise, for example, titanium, cobalt, nickel, the like or a combination thereof, and may be deposited by ALD, CVD, or another deposition technique. The metal layer 114 may be deposited to a thickness in a range from 2 nm to about 15 nm, for example. The barrier layer 116 may be or comprise titanium nitride, titanium oxide, tantalum nitride, tantalum oxide, the like, or a combination thereof, and may be deposited by ALD, CVD, or another deposition technique. The barrier layer 116 may be deposited to a thickness in a range from 2 nm to about 15 nm, for example.

Figure 15B:
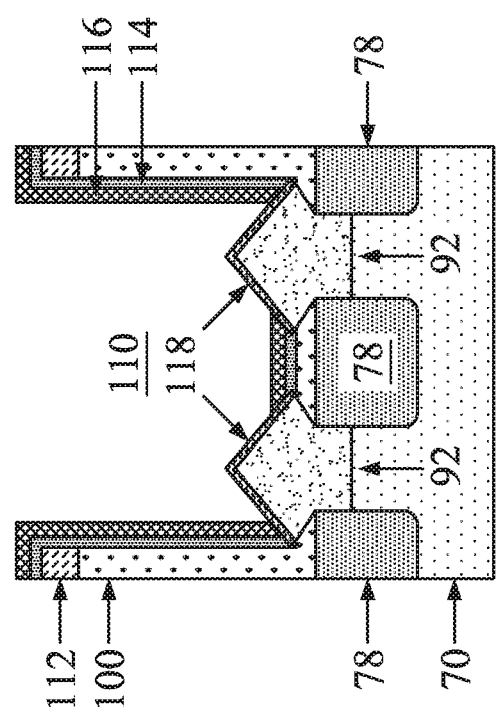
Figure 15A:
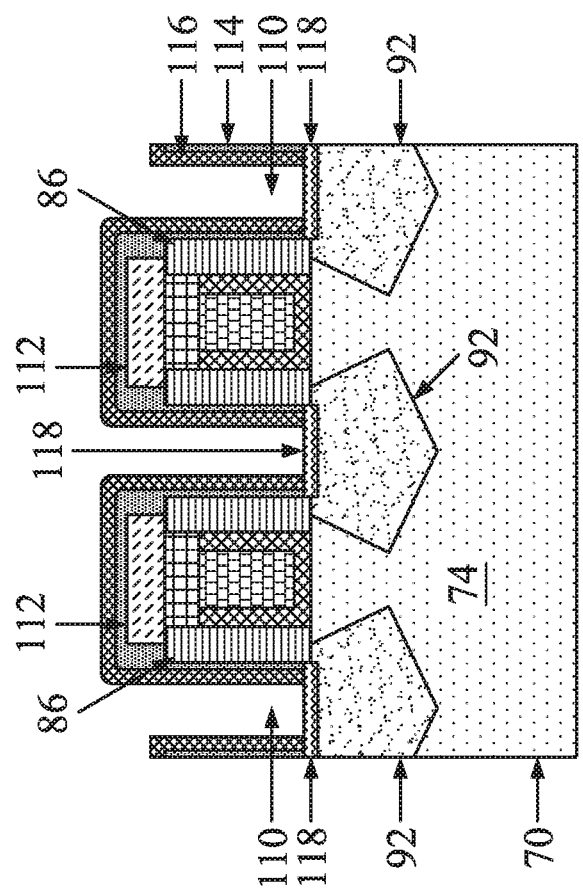

FIGS. 15A and 15B illustrate the formation of silicide regions 118 on upper portions of the epitaxy source/drain regions 92. The silicide regions 118 may be formed by reacting upper portions of the epitaxy source/drain regions 92 with the metal layer 114 and/or barrier layer 116. An anneal is performed to facilitate the reaction of the epitaxy source/drain regions 92 with the metal layer 114 and/or barrier layer 116. The anneal may be at a temperature in a range from about 500° C. to about 600° C. for a duration of greater than or equal to about 10 seconds. The silicide regions 118 may have a thickness in a range from 2 nm to about 20 nm, for example. In some examples, an etch may be performed to remove unreacted portions of the metal layer 114 and/or barrier layer 116.

Figure 16B:
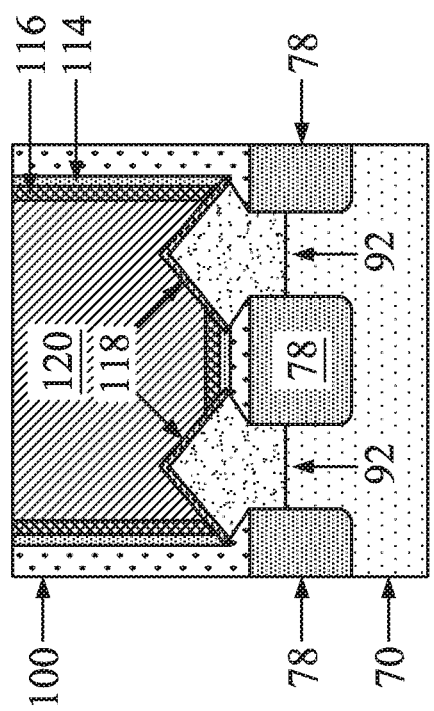
Figure 16A:
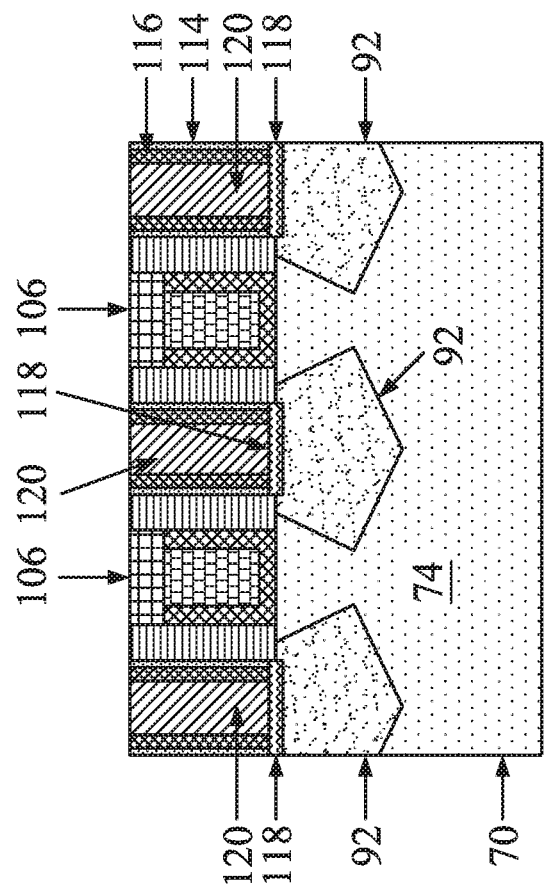

FIGS. 16A and 16B illustrate the formation of contacts 120 filling the openings 110. The contacts 120 may be or comprise tungsten, copper, aluminum, gold, silver, alloys thereof, the like, or a combination thereof, and may be deposited by CVD, ALD, PVD, or another deposition technique. After the material of the contacts 120 is deposited, excess material may be removed by using a planarization process, such as a CMP, for example. The planarization process may remove excess material of the contacts 120, barrier layer 116, metal layer 114, and mask 112 from above the top surface of the one or more dielectric layers 100. Hence, top surfaces of the contacts 120, barrier layer 116, metal layer 114, and one or more dielectric layers 100 may be coplanar. Accordingly, conductive features including the contacts 120, barrier layer 116, metal layer 114, and/or silicide regions 118 may be formed to the epitaxy source/drain regions 92.

Although the conductive features (e.g., including the contacts 120) are depicting as having a certain configuration in the figures, the conductive features can have any configuration. For example, separate conductive features may be formed to separate epitaxy source/drain regions 92. A person having ordinary skill in the art will readily understand modifications to process steps described herein to achieve different configurations.

Figure 17B:
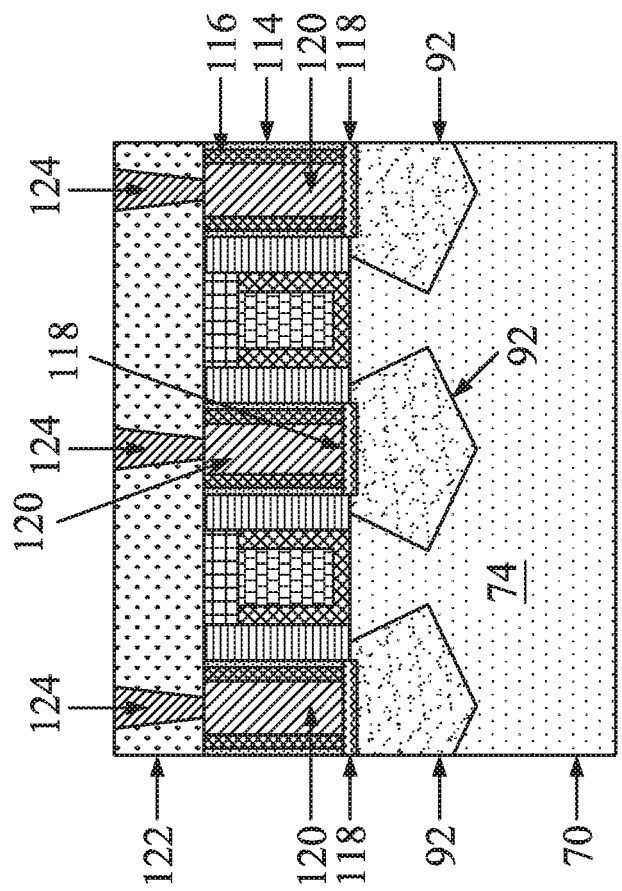
Figure 17A:
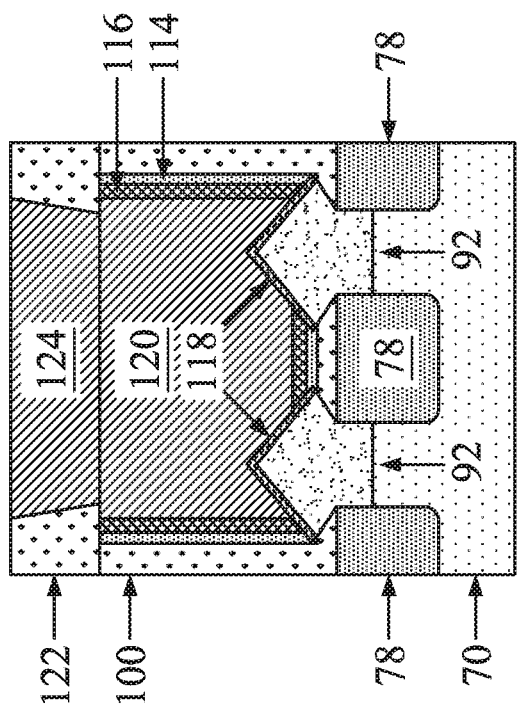

FIGS. 17A and 17B illustrate the formation of one or more dielectric layers 122 and conductive features 124 in the one or more dielectric layers 122. The one or more dielectric layers 122 may include an etch stop layer (ESL) and an interlayer dielectric (ILD) or intermetal dielectric (IMD), for example. The etch stop layer may be deposited over the one or more dielectric layers 100, contacts 120, masks 106, etc. The etch stop layer may comprise or be silicon nitride, silicon carbon nitride, silicon carbon oxide, carbon nitride, the like, or a combination thereof, and may be deposited by CVD, PECVD, ALD, or another deposition technique. The interlayer dielectric or intermetal dielectric may comprise or be silicon dioxide, a low-K dielectric material, such as silicon oxynitride, PSG, BSG, BPSG, USG, FSG, OSG, SiO$_x$C$_y$, Spin-On-Glass, Spin-On-Polymers, silicon carbon material, a compound thereof, a composite thereof, the like, or a combination thereof. The interlayer dielectric or intermetal dielectric may be deposited by spin-on, CVD, FCVD, PECVD, PVD, or another deposition technique.

Recesses and/or openings are formed in and/or through the one or more dielectric layers 122 where the conductive features 124 are to be formed. The one or more dielectric layers 122 may be patterned with the recesses and/or openings, for example, using photolithography and one or more etch processes. The conductive features 124 may then be formed in the recesses and/or openings. The conductive features 124 may include a barrier layer and conductive material formed on the barrier layer, for example. The barrier layer can be conformally deposited in the recesses and/or openings and over the one or more dielectric layers 122. The barrier layer may be or comprise titanium nitride, titanium oxide, tantalum nitride, tantalum oxide, the like, or a combination thereof, and may be deposited by ALD, CVD, or another deposition technique. The conductive material may be or comprise tungsten, copper, aluminum, gold, silver, alloys thereof, the like, or a combination thereof, and may be deposited by CVD, ALD, PVD, or another deposition technique. After the material of the conductive features 124 is deposited, excess material may be removed by using a planarization process, such as a CMP, for example. The planarization process may remove excess material of the conductive features 124 from above a top surface of the one or more dielectric layers 122. Hence, top surfaces of the conductive features 124 and the one or more dielectric layers 122 may be coplanar. The conductive features 124 may be or may be referred to as contacts, vias, conductive lines, etc.

FIGS. 18A-B through 19A-B are cross-sectional views of intermediate stages in an example process of forming one or more FinFETs in accordance with some embodiments. In FIGS. 18A-B through 19A-B, figures ending with an "A" designation illustrate cross-sectional views along a cross-section similar to cross-section A-A in FIG. 1, and figures ending with a "B" designation illustrate cross-sectional views along a cross-section similar to cross-section B-B in FIG. 1. In some figures, some reference numbers of components or features illustrated therein may be omitted to avoid obscuring other components or features; this is for ease of depicting the figures.

In the example process of FIGS. 18A-B through 19A-B, processing proceeds as described above with respect to FIGS. 2A-B through 8A-B and 11A-B through the formation of openings 110 through the one or more dielectric layers 100 in FIGS. 13A-B. In this example, the processing shown in FIGS. 9A-B and 10A-B is omitted. The processing in this example resumes at FIGS. 18A-B.

Figure 18B:
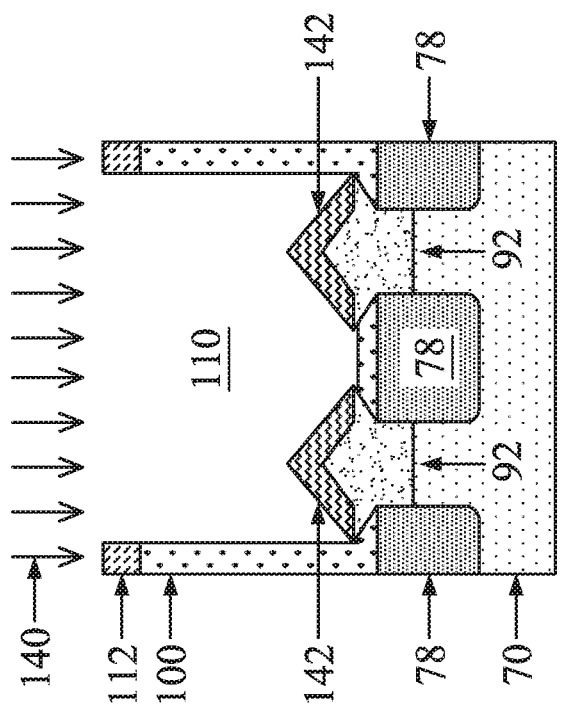
FIGS. 18A-B and 19A-B are cross-sectional views of intermediate stages in another example process of forming one or more FinFETs in accordance with some embodiments.
Figure 18A:
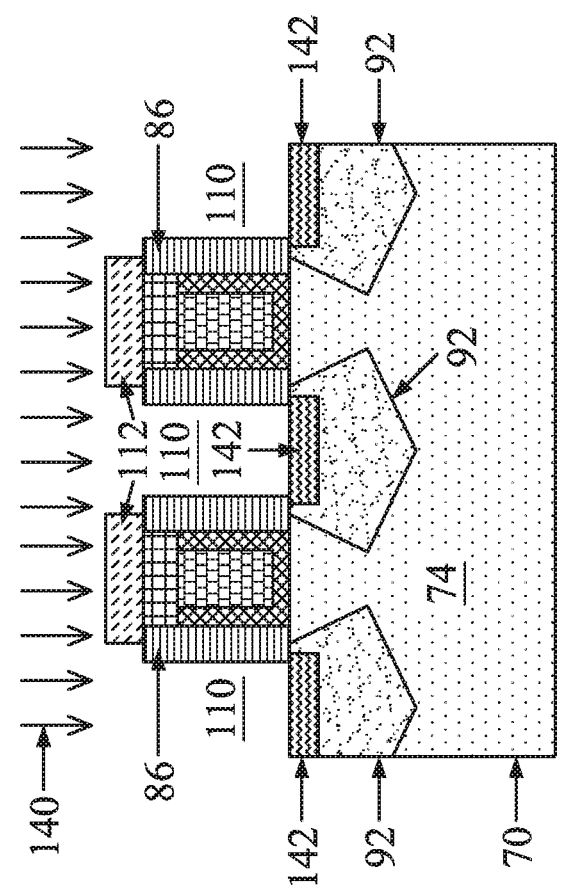

FIGS. 18A and 18B illustrate an amorphization implant 140. The amorphization implant 140 may be omitted in some implementations. In some examples, the amorphization implant 140 includes implanting an impurity species through the openings 110 through the one or more dielectric layers 100 into the epitaxy source/drain regions 92 to make upper portions 142 of the epitaxy source/drain regions 92 amorphous. The upper portions 142 that are made amorphous can extend from respective upper surfaces of the epitaxy source/drain regions 92 to a depth from about 2 nm to about 20 nm, for example. In some examples, such as for a p-type device, the epitaxy source/drain regions 92 are Si$_x$Ge$_{1-x}$, and germanium is the species implanted to amorphize the upper portions 142 of the epitaxy source/drain regions 92. In such examples, the implant energy can be in a range from about 1 keV to about 15 keV, such as about 10 keV, with a dosage concentration in a range from about $5\times10^{13}$ cm$^{-2}$ to about $5\times10^{14}$ cm$^{-2}$.

Figure 19A:
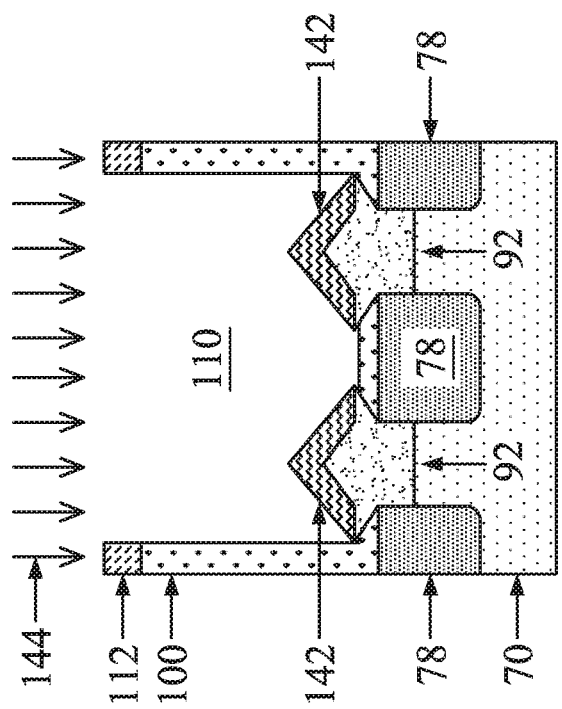
Figure 19B:
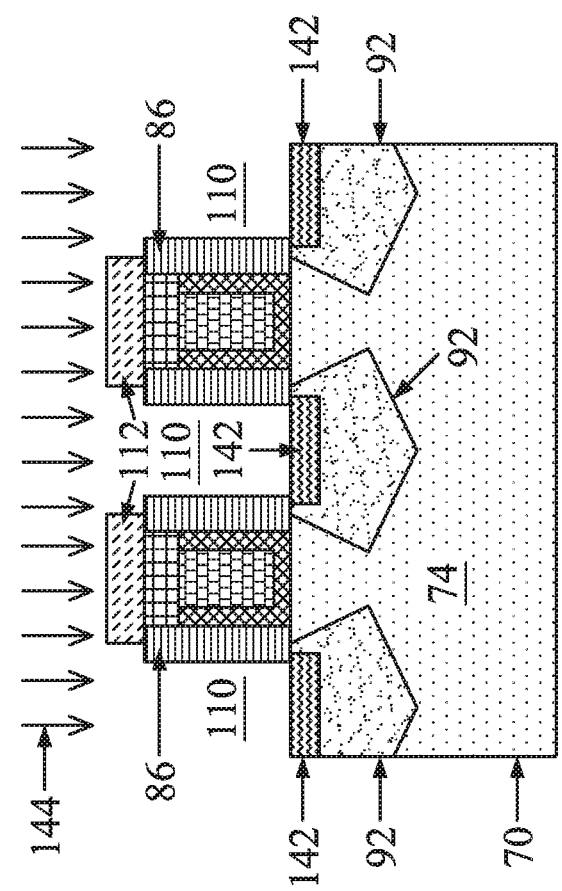

FIGS. 19A and 19B illustrate a dopant implant 144 into the upper portions 142 of the epitaxy source/drain regions 92. The dopant implant 144 may implant dopants through the openings 110 through the one or more dielectric layers 100 to the upper portions 142 to reduce a contact resistance between the respective epitaxy source/drain region 92 and a conductive feature (e.g., including a contact) that is subsequently formed. In some examples, the species of the dopant used for the dopant implant 144 may amorphize the upper portions 142 when implanted (and hence, may be referred to as self-amorphizing). In those examples or in different examples, the amorphization implant 140 of FIGS. 18A and 18B may be omitted. The dopant implant 144 may implant dopants to the upper portions 142 such that the upper portions 142 have a consistent concentration of the dopant from the respective upper surfaces of the upper portions 142 to depths of equal to or greater than 5 nm, equal to or greater than 10 nm, or equal to or greater than 15 nm. The consistent concentration of the dopant can be greater than the concentration of the dopant that delineates, at least in part, the source/drain regions (e.g., formed by implantation and/or in situ doping during epitaxial growth). The concentration of the dopant in the epitaxy source/drain regions 92 may decrease from the consistent concentration into further depths of the epitaxy source/drain regions 92. Additional example details of the dopant implant 144 and the concentrations of the dopant resulting from the dopant implant 144 are described with respect to FIGS. 20 and 21 below.

In some examples, such as for a p-type device, the epitaxy source/drain regions 92 are Si$_x$Ge$_{1-x}$, and gallium is the species implanted into the upper portions 142 of the epitaxy source/drain regions 92 for the dopant implant 144. In such examples, the implant energy can be in a range from about 0.5 keV to about 10 keV, with a dosage concentration in a range from about $1\times10^{15}$ cm$^{-2}$ to about $1\times10^{16}$ cm$^{-2}$. The consistent concentration of gallium from the upper surfaces of the epitaxy source/drain regions 92 to the depth may be in a range from about $10^{21}$ cm$^{-3}$ to about $10^{22}$ cm$^{-3}$, and more particularly, about $5\times10^{21}$ cm$^{-3}$.

After the dopant implant 144, an anneal is performed to activate the dopants and recrystallize the upper portions 142 that were amorphized (e.g., by the amorphization implant 140 and/or by the dopant implant 144). The anneal, in some examples, may be at a temperature in a range from about 600° C. to about 900° C. for a duration in a range equal to or less than about one minute, equal to or less than about 12 seconds, or equal to or less than about 1 second. In other examples, the anneal may be a laser anneal performed for a duration of several nanoseconds, such as equal to or less than about 100 ns. In further examples, the anneal may be a melting anneal performed for a duration of a few nanoseconds, such as about 1 ns.

In the example process of FIGS. 18A-B through 19A-B, processing resumes with an amorphization implant, if implemented, through the processing of FIGS. 14A-B through FIGS. 17A-B.

Figure 20:
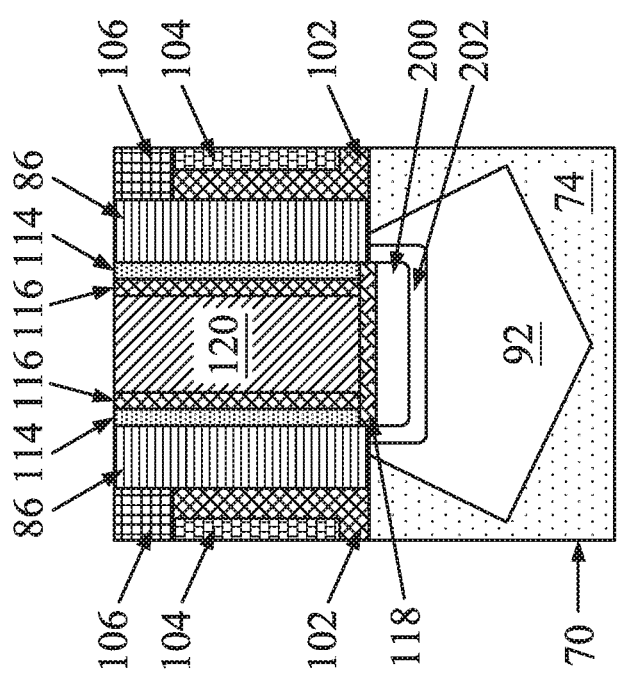
FIG. 20 is a cross-sectional view of a conductive feature and source/drain region in accordance with some embodiments.

FIG. 20 illustrates a cross-sectional view of the conductive feature (e.g., including the contact 120) and epitaxy source/drain region 92 in accordance with some embodiments. The epitaxy source/drain region 92 includes a platform dopant region 200 and a tailing dopant region 202. The dopant concentration, e.g., of the dopant implanted in FIGS. 10A-B and 19A-B, in the platform dopant region 200 is substantially consistent or constant throughout the platform dopant region 200. From the substantially consistent or constant dopant concentration in the platform dopant region 200, the dopant concentration decreases with a gradient in the tailing dopant region 202.

Figure 21:
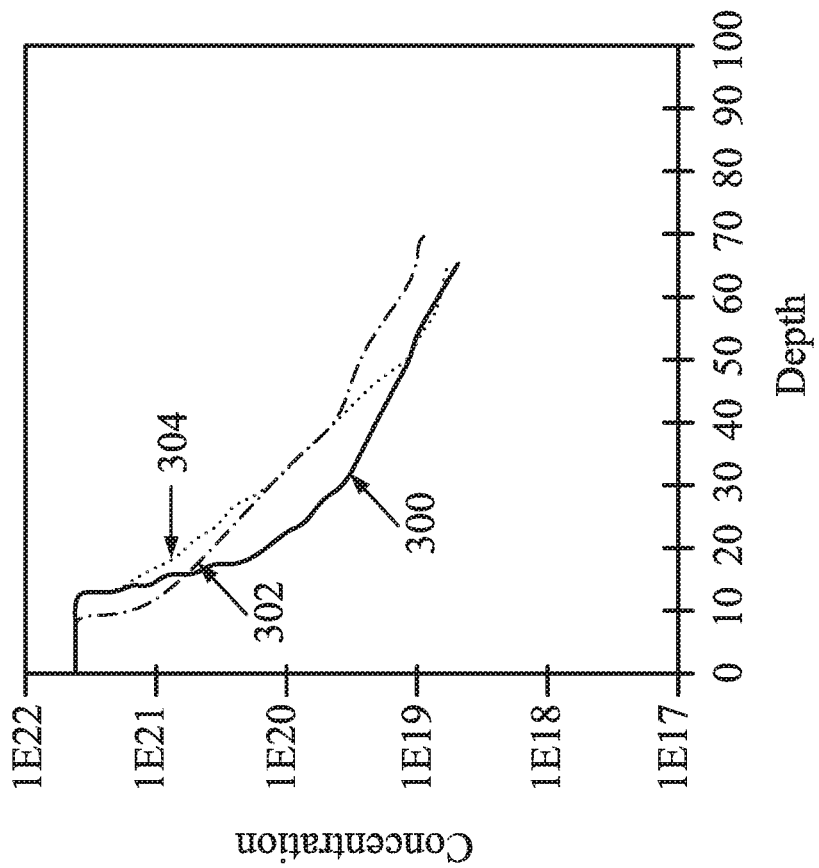
FIG. 21 is a graph illustrating various dopant profiles in accordance with some embodiments.

FIG. 21 is a graph illustrating various dopant profiles in accordance with some embodiments. The graph illustrates an as-implanted dopant profile 300 (e.g., with or without an amorphization implant preceding the dopant implant), a first as-annealed dopant profile 302 without a preceding amorphization implant, and a second as-annealed dopant profile 304 with a preceding amorphization implant. The illustrated dopant profiles are for gallium implanted into silicon germanium. Any amorphization implants for the profiles 300 and 304 use germanium as the implant species, and anneals for the profiles 302 and 304 are a rapid thermal anneal at 1000° C. Other dopants, materials into which the dopant is implanted, amorphization species, or anneals may be used in other examples.

As illustrated, each of the profiles 300, 302, and 304 have a substantially consistent or constant dopant concentration throughout a depth up to about 8 nm (e.g., for the profile 302) or about 12 nm (e.g., for the profiles 300 and 304). These substantially consistent or constant dopant concentrations may be the platform dopant region 200 in some examples. From these substantially consistent or constant dopant concentrations (e.g., beginning at a depth of about 8 nm, e.g., for the profile 302, or about 12 nm, e.g., for the profiles 300 and 304), the dopant concentrations decrease as the profile extends away from the substantially consistent or constant dopant concentrations (e.g., as depth increases) in the profiles 300, 302, and 304.

As described previously, in some examples, the dopant species for the dopant implant may be gallium. Gallium may, in some examples, have advantageous aspects. For example, gallium has a higher solid solubility in germanium than other dopant species, such as boron. Hence, when a germanium content in the epitaxy source/drain regions 92 is high, gallium may have a higher activation, and hence, contribute more holes, in comparison to other dopants. Additionally, gallium (e.g., Ga$^{69}$) may be larger, on an atomic scale, than other species, such as boron. This may permit implants of gallium to be self-amorphizing, and hence, an amorphization implant preceding an implant of gallium may be omitted.

Furthermore, the platform concentrations of the doping profiles illustrated in FIG. 21 that can be achieved by implanting gallium can facilitate having an appropriate concentration at a surface of the epitaxy source/drain regions 92 and/or silicide regions 118. For example, in some example processes, some loss of the epitaxy source/drain regions 92 may be realized as a result of etching, such as during processing illustrated in FIGS. 13A-B. In some examples, even with some loss of the epitaxy source/drain regions 92, such as a 5 nm loss (e.g., such that the platform concentration remains through a depth of 3 nm, 5 nm, 7 nm, or 10 nm in the epitaxy source/drain regions 92), the platform concentration may permit the concentration of the dopant at the surface to remain substantially unchanged. Other dopant species may not be able to achieve a platform concentration, and hence, with some loss of the epitaxy source/drain regions 92, a concentration of the dopant at the surface can decrease. Accordingly, in some examples, a high concentration of dopant may be achieved that can reduce a contact resistance to the epitaxy source/drain region 92 (e.g., between the conductive feature 120 and the epitaxy source/drain region 92).

Also, gallium may be less likely to diffuse than other dopant species. This may permit the dopant profile to remain close to the as-implanted dopant profile after subsequent processing, such as after an anneal. This may permit more flexibility in processing for thermal budgets. For example, the dopant implant may be performed before various high temperature processes. Further, since gallium may be less prone to diffusing, short channel effects in a transistor, like a FinFET, may be mitigated.

Figure 22:
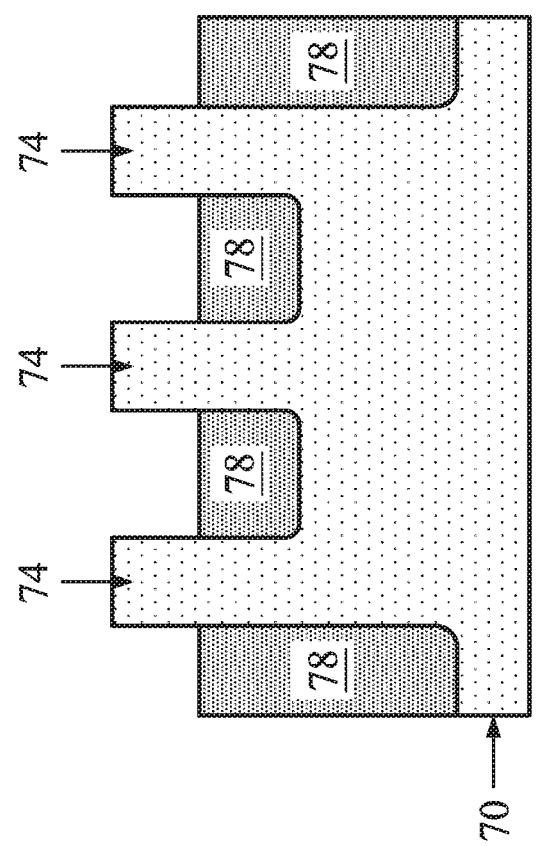
FIG. 22 is a cross-sectional view of a portion of an example device structure in accordance with some embodiments.

As previously indicated, the device structures may vary in different implementations. FIG. 22 illustrates a cross-sectional view of a portion of another implementation of a device structure in accordance with some embodiments. The structure of FIG. 22 may be referred to as a "crown" structure, whereas the structure of, e.g., FIG. 4B may be referred to as a "non-crown" structure. As depicted in FIG. 22, the lower surfaces of the isolation regions 78 may be at varying levels. This may be obtained during patterning the semiconductor substrate 70 in forming the fins 74, such as by two or more patterning and etching processes.

An embodiment is a structure. The structure includes an active region of a transistor. The active region includes a source/drain region, and the source/drain region is defined at least in part by a first dopant having a first dopant concentration. The source/drain region further includes a second dopant with a concentration profile having a consistent concentration from a surface of the source/drain region into a depth of the source/drain region. The consistent concentration is greater than the first dopant concentration. The structure further includes a conductive feature contacting the source/drain region at the surface of the source/drain region.

In an embodiment, the active region comprises a fin, and the transistor is a Fin Field Effect Transistor (FinFET). In an embodiment, the source/drain region includes a germanium-containing material, and the second dopant includes a gallium-containing species. In an embodiment, the depth is at least 10 nm, and in another embodiment, the depth is at least 5 nm. In an embodiment, the consistent concentration is greater than $1 \times 10^{21}$ cm$^{-3}$. In an embodiment, the structure further includes a dielectric layer, and at least a portion of the conductive feature is in at least a portion of the dielectric layer. In an embodiment, the conductive feature includes a silicide at the surface of the source/drain region and a contact to the silicide.

Another embodiment is a structure. The structure includes a substrate comprising a fin, and a gate structure over the fin. The fin has a source/drain region. The source/drain region includes a germanium-containing material, and the source/drain region further includes a profile of a gallium concentration. The profile has a platform at a surface of the source/drain region and decreases from the platform into the source/drain region. The structure further includes a silicide region on the surface of the source/drain region, and a contact on the silicide region.

In an embodiment, the platform extends from the surface of the source/drain region into the source/drain region at least 10 nm, and in another embodiment, the platform extends from the surface of the source/drain region into the source/drain region at least 5 nm. In an embodiment, the platform has a concentration greater than $1 \times 10^{21}$ cm$^{-3}$. In an embodiment, the source/drain region includes a dopant having a concentration less than a concentration of the platform throughout the source/drain region.

A further embodiment is a method. An active area on a substrate is defined. The active area includes a source/drain region, and the source/drain region is defined at least in part by a first dopant having a first concentration. A second dopant is implanted into the source/drain region. The second dopant has a consistent concentration extending from a surface of the source/drain region to a depth in the source/drain region. The consistent concentration is greater than the first concentration. A conductive feature is formed contacting the source/drain region.

In an embodiment, the source/drain region includes a germanium-containing material, and the second dopant includes a gallium-containing species. In an embodiment, implanting the second dopant into the source/drain region amorphizes at least a portion of the source/drain region. In an embodiment, the method further includes amorphizing at least a portion of the source/drain region including implanting an amorphizing impurity into the source/drain region before implanting the second dopant. In an embodiment, the depth is at least 15 nm, and in another embodiment, the depth is at least 10 nm. In an embodiment, defining the active area on the substrate includes defining the source/drain region in the active area, and defining the source/drain region includes epitaxially growing the source/drain region. In an embodiment, epitaxially growing the source/drain region includes in situ doping the source/drain region with the first dopant. In an embodiment, a dielectric layer is formed over the source/drain region, and an opening is formed through the dielectric layer to expose at least a portion of the source/drain region. In an embodiment, implanting the second dopant is performed after forming the opening, and the conductive feature is formed in the opening. In an embodiment, the dielectric layer is formed after implanting the second dopant, and the conductive feature is formed in the opening. In an embodiment, forming the conductive feature includes forming a silicide at the surface of the source/drain region, and forming a contact to the silicide.

Another embodiment is a structure. The structure includes a substrate includes an active area. The source/drain region includes a dopant having a platform concentration of the dopant from a surface of the active area to a first depth in the source/drain region and a decreasing concentration of the dopant from the first depth to a second depth in the source/drain region. The structure further includes a gate structure over the active area of the substrate and proximate to the source/drain region, and a conductive feature over the substrate and contacting the source/drain region.

In an embodiment, the active area includes a fin, and the gate structure is over the fin. In an embodiment, the source/drain region includes silicon germanium, and the dopant includes a gallium species. In an embodiment, the first depth is at least 10 nm, and in another embodiment, the first depth is at least 5 nm. In an embodiment, the platform concentration is greater than $1 \times 10^{21}$ cm$^{-3}$. In an embodiment, the structure further includes a dielectric layer. In an embodiment, at least a portion of the conductive feature is in at least a portion of the dielectric layer, and the conductive feature includes a silicide at the surface of the active area and a contact to the silicide.

Another embodiment is a method. A gate structure is formed over an active area of a substrate. A source/drain region is formed in the active area and proximate the gate structure. After forming the source/drain region, a dopant is implanted into the source/drain region. The dopant has a consistent platform concentration from a surface of the source/drain region to a depth of the source/drain region. A conductive feature is formed over the substrate and to the source/drain region.

In an embodiment, the source/drain region includes a silicon germanium material, and the dopant includes gallium. In an embodiment, implanting the dopant into the source/drain region amorphizes at least a portion of the source/drain region. In an embodiment, the method further includes amorphizing at least a portion of the source/drain region including implanting an amorphizing impurity into the source/drain region before implanting the dopant. In an embodiment, the depth is at least 15 nm, and in another embodiment, the depth is at least 10 nm. In an embodiment, forming the source/drain region includes epitaxially growing the source/drain region. In an embodiment, epitaxially growing the source/drain region includes in situ doping the source/drain region with an additional dopant having a concentration less than the consistent platform concentration. In an embodiment, forming the conductive feature includes: forming a silicide at the surface of the source/drain region, and forming a contact to the silicide. In an embodiment, the method further includes forming a dielectric layer over the source/drain region, and forming an opening through the dielectric layer to expose at least a portion of the source/drain region. In an embodiment, implanting the dopant is performed after forming the opening, and the conductive feature is formed in the opening. In an embodiment, the dielectric layer is formed over the source/drain region after implanting the dopant, and the conductive feature is formed in the opening.

Another embodiment is a method. A fin is formed on a substrate. A gate structure is formed over the fin. A source/drain region is defined in the fin, and the source/drain region includes a germanium-containing material. A gallium-containing dopant is implanted in the source/drain region. The gallium-containing dopant has a concentration profile with a platform from a surface of the source/drain region to a first depth in the source/drain region and a decreasing gradient from the first depth to a second depth in the source/drain region. A conductive feature is formed to the source/drain region.

In an embodiment, implanting the gallium-containing dopant in the source/drain region amorphizes at least a portion of the source/drain region. In an embodiment, the method further includes amorphizing at least a portion of the source/drain region including implanting a germanium-containing impurity into the source/drain region before implanting the gallium-containing dopant. In an embodiment, the first depth is at least 15 nm, and in another embodiment, the first depth is at least 10 nm. In an embodiment, defining the source/drain region includes: forming a recess in the fin, and epitaxially growing the source/drain region in the recess. In an embodiment, epitaxially growing the source/drain region includes in situ doping the source/drain region with an additional dopant having a concentration less than the platform of the concentration profile. In an embodiment, forming the conductive feature further includes: forming a silicide at the surface of the source/drain region, and forming a contact to the silicide. In an embodiment, the method further includes: forming a dielectric layer over the source/drain region, and forming an opening through the dielectric layer to expose at least a portion of the source/drain region. In an embodiment, implanting the gallium-containing dopant is performed after forming the opening, and the conductive feature is formed in the opening. In an embodiment, the dielectric layer is formed over the source/drain region after implanting the gallium-containing dopant, and the conductive feature is formed in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   an active region of a transistor, the active region comprising a source/drain region, the source/drain region being defined at least in part by a silicon germanium layer, the source/drain region further including a first dopant with a concentration profile having a consistent concentration from a surface of the source/drain region into a depth of the source/drain region, the concentration profile further having a decreasing concentration extending from the consistent concentration into the source/drain region as the concentration profile extends away from the surface of the source/drain region; and
   a conductive feature contacting the source/drain region at the surface of the source/drain region.

2. The structure of claim 1, wherein the active region comprises a fin, and the transistor is a Fin Field Effect Transistor (FinFET).

3. The structure of claim 1, the first dopant comprises a gallium-containing species.

4. The structure of claim 1, wherein the depth is at least 10 nm.

5. The structure of claim 1, wherein the depth is at least 5 nm.

6. The structure of claim 1, wherein the consistent concentration is greater than $1 \times 10^{21}$ cm$^{-3}$.

7. The structure of claim 1 further comprising a dielectric layer, wherein at least a portion of the conductive feature is in at least a portion of the dielectric layer, and wherein the conductive feature comprises a silicide at the surface of the source/drain region and a contact to the silicide.

8. A structure comprising:
   a substrate comprising a fin, the fin having a source/drain region, the source/drain region comprising a germanium-containing material, the source/drain region further comprising a profile of a gallium concentration, the profile having a platform having a uniform gallium concentration extending from a surface of the source/drain region to a first depth into the source/drain region and decreasing from the platform into the source/drain region;
   a gate structure over the fin;
   a silicide region on the surface of the source/drain region; and
   a contact on the silicide region.

9. The structure of claim 8, wherein the platform extends from the surface of the source/drain region into the source/drain region at least 10 nm.

10. The structure of claim 8, wherein the platform extends from the surface of the source/drain region into the source/drain region at least 5 nm.

11. The structure of claim 8, wherein the platform has a concentration greater than $1 \times 10^{21}$ cm$^{-3}$.

12. The structure of claim 8, wherein the source/drain region comprises a dopant having a concentration less than a concentration of the platform throughout the source/drain region.

13. A structure comprising:
   a gate structure over a channel region of a substrate;
   a first source/drain region in a semiconductor region adjacent the gate structure, wherein the first source/drain region comprises:
      a platform dopant region, wherein a first concentration of a first dopant in the platform dopant region is constant from an upper surface of the semiconductor region to a first depth; and
      a tailing dopant region in the first source/drain region, wherein a second concentration of the first dopant in the tailing dopant region decreases as the tailing dopant region extends away from the platform dopant region;
   a silicide region on the platform dopant region; and
   a contact on the silicide region.

14. The structure of claim 13, wherein the first dopant comprises gallium.

15. The structure of claim 13, wherein the first depth is at least 15 nm.

16. The structure of claim 13, wherein the first depth is at least 10 nm.

17. The structure of claim 13, wherein the silicide region is contained within the platform dopant region.

18. The structure of claim 13, wherein a material of the channel region is different than a material of the first source/drain region.

19. The structure of claim 13 further comprising a spacer adjacent the gate structure, wherein the platform dopant region extends under the spacer.

20. The structure of claim 13 further comprising isolation regions on opposing sides of the first source/drain region, wherein the first source/drain region extends over the isolation regions, wherein a surface of the first source/drain region over and facing the isolation regions are free of the platform dopant region.

* * * * *